(12) United States Patent
Kawano

(10) Patent No.: US 7,304,511 B2
(45) Date of Patent: Dec. 4, 2007

(54) OUTPUT CIRCUIT FOR INTERFACING BETWEEN DIFFERENT POWER SUPPLY VOLTAGES

(75) Inventor: Harumi Kawano, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 103 days.

(21) Appl. No.: 11/165,229

(22) Filed: Jun. 24, 2005

(65) Prior Publication Data
US 2006/0044024 A1 Mar. 2, 2006

(30) Foreign Application Priority Data
Aug. 24, 2004 (JP) ............................. 2004-244186

(51) Int. Cl.
*H03K 3/00* (2006.01)
(52) U.S. Cl. ........................... 327/108; 326/82; 326/83
(58) Field of Classification Search ................ 327/108; 326/82, 83
See application file for complete search history.

(56) References Cited

U.S. PATENT DOCUMENTS

| | | | | |
|---|---|---|---|---|
| 5,635,861 A | * | 6/1997 | Chan et al. ................... | 326/81 |
| 5,963,055 A | * | 10/1999 | Tanaka et al. ................. | 326/81 |
| 5,990,705 A | * | 11/1999 | Lim ............................. | 326/81 |
| 6,078,197 A | * | 6/2000 | Kawano ...................... | 327/108 |
| 6,269,042 B1 | * | 7/2001 | Kawano et al. .............. | 365/226 |
| 6,326,835 B1 | * | 12/2001 | Kawano ...................... | 327/537 |
| 6,803,789 B1 | * | 10/2004 | Yu et al. ....................... | 326/81 |

FOREIGN PATENT DOCUMENTS

| | | |
|---|---|---|
| JP | 08-265131 | 10/1996 |
| JP | 2001-211064 | 8/2001 |
| JP | 3432229 | 5/2003 |

\* cited by examiner

*Primary Examiner*—Kenneth B. Wells
(74) *Attorney, Agent, or Firm*—Rabin & Berdo, P.C.

(57) ABSTRACT

An output circuit has a power supply terminal, a ground terminal, and an output terminal for connection with an external power supply voltage. The output circuit generates a voltage through the output terminal within a certain potential range. This potential range is determined by a potential of the power supply terminal and a potential of the ground terminal. The output circuit includes a first transistor having one main electrode connected to the power supply terminal and the other main electrode connected to the output terminal. The output circuit also includes a second transistor having one main electrode connected to a control electrode of the first transistor and the other main electrode connected to the output terminal. The output circuit also includes an earth circuit connected to the control electrode of the first transistor for removing charges stored thereon. The second transistor is turned on when the voltage of the output terminal is beyond the above-mentioned potential range. The first transistor is turned off as the voltage of the output terminal is introduced to the control electrode of the first transistor when the second transistor is turned on.

9 Claims, 6 Drawing Sheets

US 7,304,511 B2

OUTPUT CIRCUIT FOR INTERFACING BETWEEN DIFFERENT POWER SUPPLY VOLTAGES

BACKGROUND OF THE INVENTION

1. Field of the Invention

The present invention relates to an output circuit, and more particularly to an output circuit which is connected to a semiconductor integrated circuit device having an external power supply voltage higher than an internal power supply voltage thereof and is appropriate for a signal interface of the semiconductor integrated circuit device.

2. Description of the Related Art

In general, since the scale of circuits which can be integrated in one semiconductor integrated circuit device is limited, a plurality of semiconductor integrated circuit devices constitute one system. In this case, however, there may be different power supply voltages in signal interfaces between the semiconductor integrated circuit devices.

For this reason, where semiconductor integrated circuit devices with different signal levels (for example, 3.3 V and 5V) are connected with each other, one of the semiconductor integrated circuit devices having a lower power supply voltage requires a signal interface corresponding to the signal level of the other semiconductor integrated circuit device having a higher power supply voltage.

In this case, it is common that the semiconductor integrated circuit device having the lower power supply voltage employs, as the signal interface, a tolerant output circuit capable of applying a higher external power supply voltage or performing a pull-up operation. Such output circuits are disclosed in, for example, Japanese Patent Nos. 3340906, 3366484 and 3432229.

In the '906 patent or '229 patent, an output circuit has three PMOS transistors formed in a floating well. When a high external potential is applied, the first and second PMOS transistors are turned off, so as to prevent the flow of external current resulting from the external potential to an internal power supply voltage.

In the output circuit of the '484 patent, even if a high power supply potential is applied from a different output driver circuit when an output terminal is in a high impedance state, the output circuit prevents the flow of current from the high power supply potential to a low power supply potential.

FIG. 2 of the accompanying drawings is a circuit diagram showing the configuration of a conventional output circuit for a semiconductor integrated circuit device, more particularly an output pull-up state buffer circuit 100.

In FIG. 2, a terminal EB receives a signal that enables/disables the circuit 100. When the EB input becomes 'L' in level (low level), an output node 32 of a 2-input NAND circuit 1 becomes 'H' in level (high level), thereby causing a PMOS transistor P9 to be turned off. Because an output node 14 of a 2-input NOR circuit 3 becomes 'L' in level, an NMOS transistor N9 is turned off, too. As a result, no signal is generated from an output terminal OUT. Consequently, the circuit 100 is disabled. On the other hand, when the EB input becomes 'H' in level, the circuit 100 is enabled and a signal corresponding to an input introduced to an input terminal IN is issued from the output terminal OUT.

In the enabled state of the circuit 100, when the IN input becomes 'H' in level, the PMOS transistor P9 is turned on and the NMOS transistor N9 is turned off, so a VDD potential (3.3V) is supplied from the output terminal OUT. In contrast, when the IN input becomes 'L' in level, the PMOS transistor P9 is turned off and the NMOS transistor N9 is turned on, so a ground potential is supplied from the output terminal OUT.

FIG. 4 of the accompanying drawings is a circuit diagram showing the configuration of a conventional output circuit 200 of an open drain type. In FIG. 4, an NMOS transistor N24 has a source connected to the drain of an NMOS transistor N25, a drain connected to an output terminal OUT and a gate connected to a power supply voltage VDD for output. Accordingly, the NMOS transistor N24 is configured to be normally on (always on). The NMOS transistor N25 has a gate connected to the output of an inverter 23, a source connected to a ground voltage GND and a drain connected to the source of the NMOS transistor N24. In the output circuit 200 of the open drain type of FIG. 4, the output signal has an amplitude between 0V and an external power supply voltage VTT (for example, 5V).

FIG. 3 of the accompanying drawings shows variations in respective potentials of the input terminal IN, output terminal OUT and node 35 in the circuit 100 of FIG. 2 when the circuit 100 is in the enabled state.

In FIG. 2, the output terminal OUT is connected to the external power supply voltage VTT (5V) via a resistor 21. When the output voltage from the output terminal OUT is the ground potential, there is no problem: the output voltage from the output terminal OUT becomes substantially the same as the ground potential because the VTT voltage is dropped across the resistor 21.

However, when the output from the output terminal OUT is the VDD potential, the VTT voltage is also dropped across the resistor 21 so that the output from the output terminal OUT stops at about VDD (3.3V), i.e., the output does not reach VTT (5V). Accordingly, there is a possibility that a device connected to the OUT terminal does not normally operate.

In the output circuit 200 of FIG. 4, when the output terminal OUT is changed from an 'L' level to an 'H' level, it generates an 'H' level signal depending on the external power supply voltage, so that the relationship between VIH and VOH as described above is satisfied without complication. That is, the amplitude of the output signal from the output terminal OUT rises to the external voltage (for example, 5V).

However, as shown in FIG. 5 of the accompanying drawings, the voltage rising of the output terminal OUT from 0V to the external power supply voltage (5V) is delayed because the speed thereof is determined by an external resistor 22.

SUMMARY OF THE INVENTION

One object of the present invention is to provide an improved output circuit which is connected to a semiconductor integrated circuit device having an external power supply voltage higher than an internal power supply voltage thereof. The output circuit is used in a signal interface of the semiconductor integrated circuit device.

According to one aspect of the present invention, there is provided an improved output circuit which has a power supply terminal, a ground terminal, and an output terminal for connection with an external power supply voltage. The output circuit generates a voltage through the output terminal within a certain potential range. This potential range is defined by a potential of the power supply terminal and a potential of the ground terminal. The output circuit includes a first transistor having one main electrode connected to the power supply terminal and the other main electrode connected to the output terminal. The output circuit also include a second transistor having one main electrode connected to a control electrode of the first transistor and the other main electrode connected to the output terminal. The output circuit also includes an earth circuit connected to the control electrode of the first transistor for removing charges stored thereon. The second transistor is turned on when the voltage of the output terminal is outside the above-mentioned potential range. The first transistor is turned off as the voltage of the output terminal is introduced to the control electrode of the first transistor when the second transistor is turned on.

When an input terminal changes to an L level from an H level and an output terminal changes from an L level to an H level, the output circuit rapidly pulls up the output terminal without delay, thereby making it possible to suppress the flow of current from an external voltage to the semiconductor integrated circuit.

BRIEF DESCRIPTION OF THE DRAWINGS

The above and other objects, aspects, features and advantages of the present invention will be more clearly understood from the following detailed description and appended claims when taken in conjunction with the accompanying drawings, in which:

DETAILED DESCRIPTION OF THE INVENTION (A) First Embodiment

A first embodiment of an output circuit according to the present invention will hereinafter be described with reference to FIGS. 1, 6 and 7.

Figure 1:
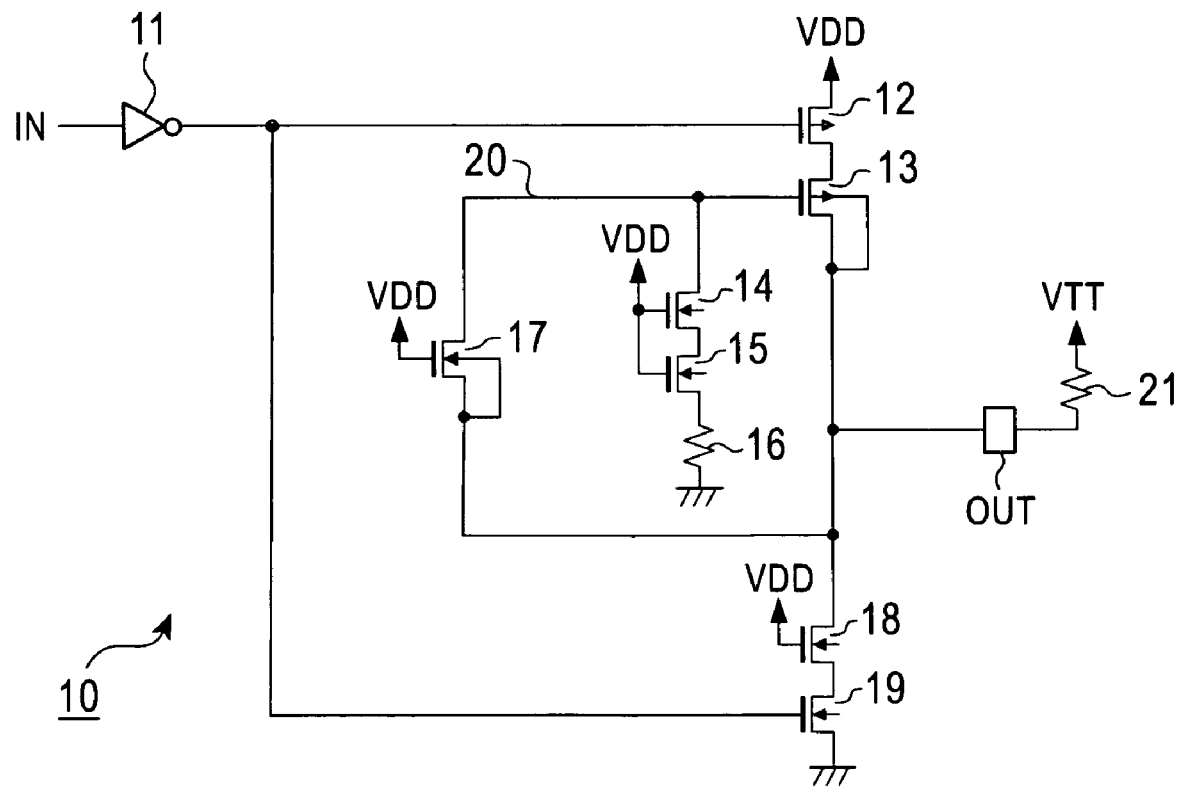
FIG. 1 is a circuit diagram showing the configuration of an output circuit according to a first embodiment of the present invention.
Figure 2:
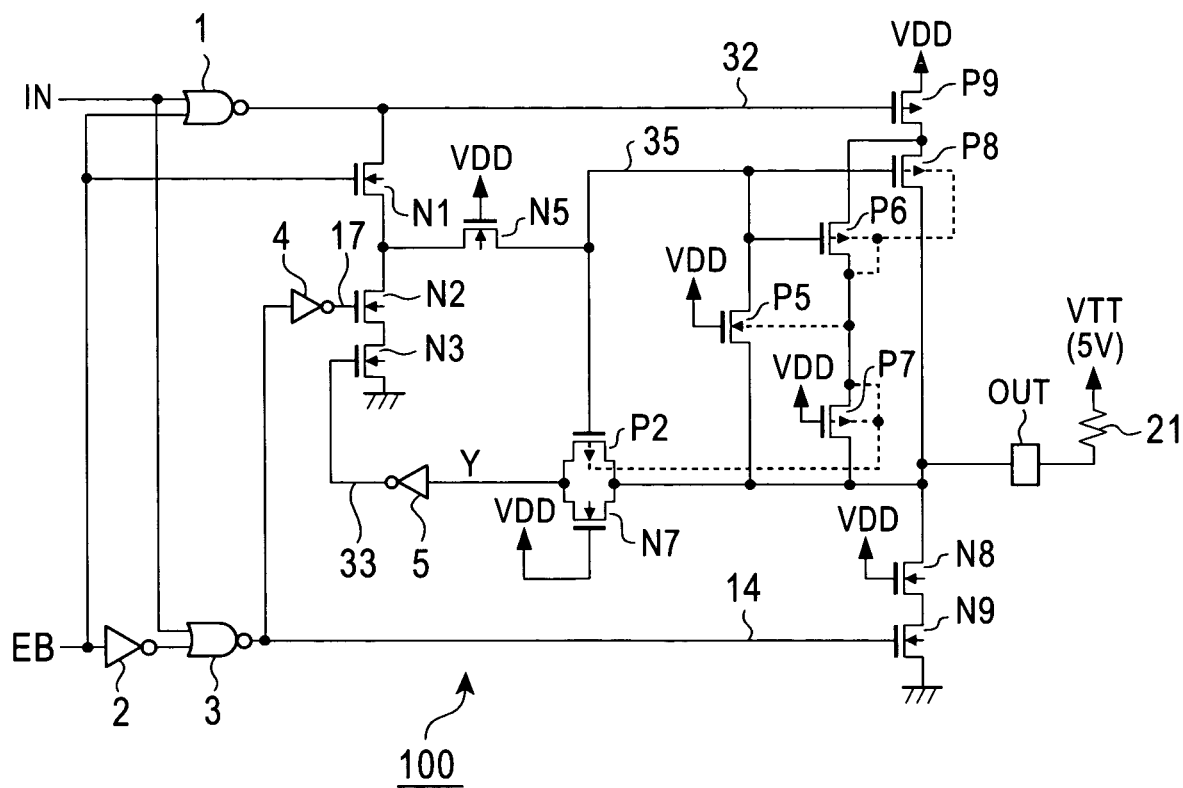
FIG. 2 is a circuit diagram showing the configuration of a conventional output circuit.
Figure 3:
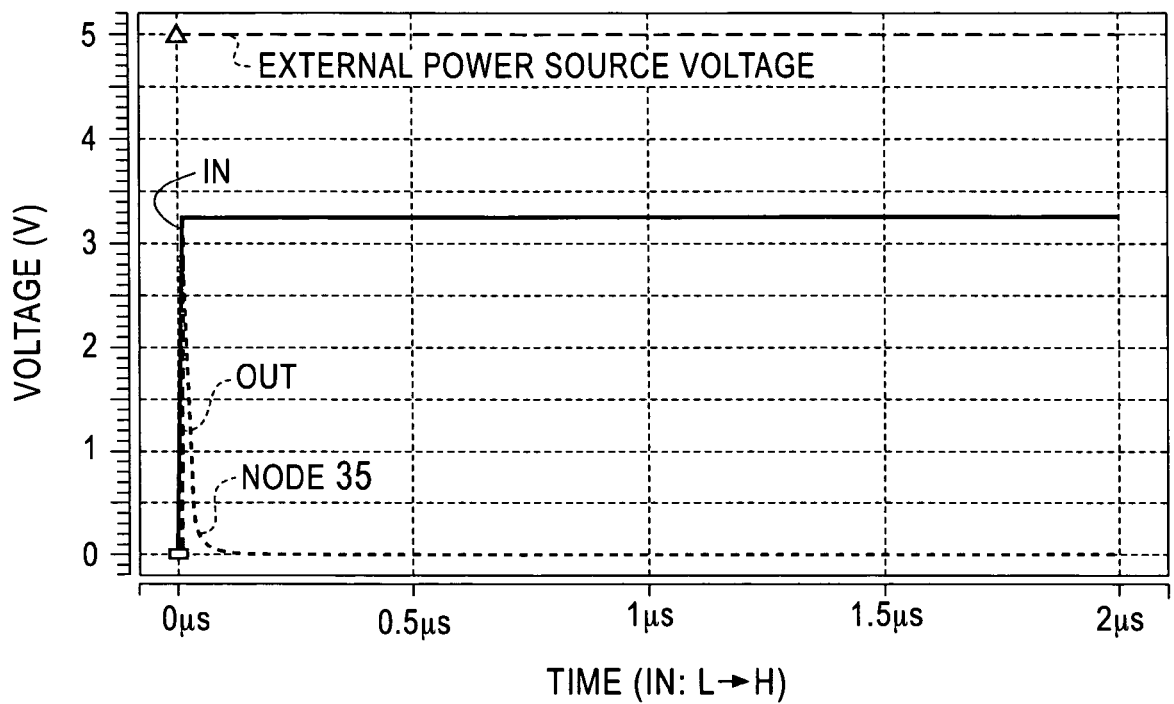
FIG. 3 is a graph showing simulation results of variations in respective potentials of an input terminal, output terminal and node in the conventional output circuit of FIG. 2.
Figure 4:
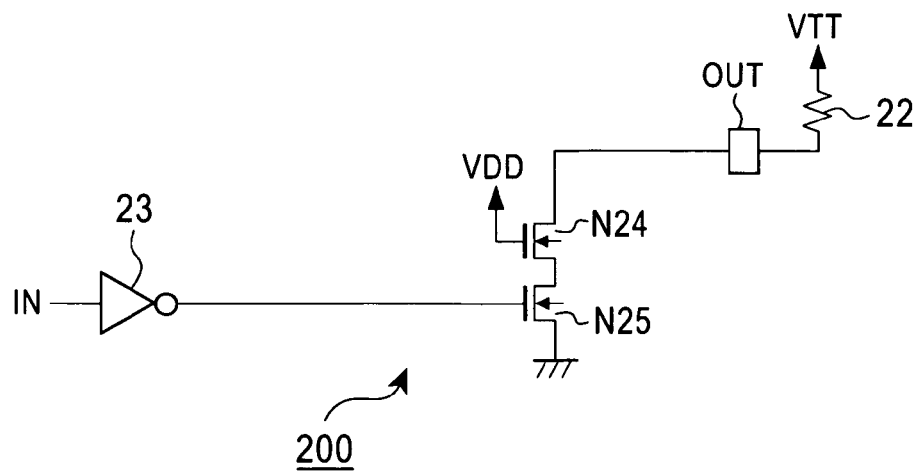
FIG. 4 is a circuit diagram showing the configuration of another conventional output circuit.
Figure 5:
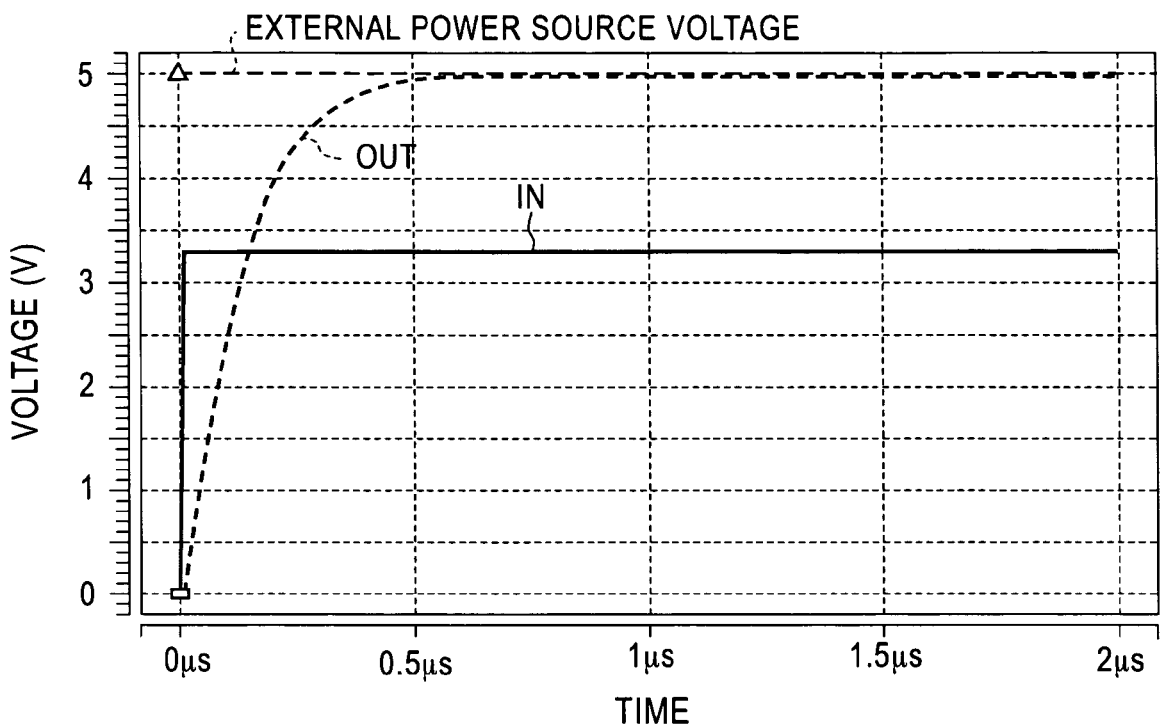
FIG. 5 is a graph showing simulation results of variations in potentials of an input terminal and output terminal in the output circuit of FIG. 4.

Referring to FIG. 1, a structure of an output circuit for a semiconductor integrated circuit according to the first embodiment of the present invention will be described.

In FIG. 1, the output circuit for the semiconductor integrated circuit is denoted by reference numeral 10 and includes an input terminal IN, an inverter circuit 11, PMOS transistors 12 and 13, NMOS transistors 14 and 15, a resistor 16, another PMOS transistor 17, another NMOS transistors 18 and 19, and an output terminal OUT.

The output terminal OUT is connected to an external power supply voltage (for example, 5V) via a resistor 21.

The input terminal IN is connected to the input of the inverter circuit 11. The output of the inverter circuit 11 is connected to the gate of the PMOS transistor 12 and the gate of the NMOS transistor 19.

The PMOS transistor 12 has the gate connected to the output of the inverter circuit 11, a source connected to a power supply voltage VDD (for example, 3.3V) for output and a drain connected to the source of the PMOS transistor 13.

The PMOS transistor 13 has a gate connected to the source of the PMOS transistor 17 and the drain of the NMOS transistor 14 through a node 20, a source connected to the drain of the PMOS transistor 12, and a drain and bulk connected to the output terminal OUT.

The NMOS transistor 18 has a gate connected to the power supply voltage VDD, a source connected to the drain of the NMOS transistor 19 and a drain connected to the output terminal OUT. Accordingly, the NMOS transistor 18 is configured to be normally on (always on). A P-type transistor or resistor may be interposed between the gate of the NMOS transistor 18 and the power supply voltage VDD to prevent electrostatic discharge (ESD).

The NMOS transistor 19 has the gate connected to the output of the inverter circuit 11, a source connected to a ground voltage GND and the drain connected to the source of the NMOS transistor 18. The NMOS transistors 18 and 19 constitute a 2-stage cascade structure.

The PMOS transistor 17 has a gate connected to the power supply voltage VDD, the source connected to the gate of the PMOS transistor 13 and the drain of the NMOS transistor 14 through the node 20 and a drain and bulk connected to the output terminal OUT.

The NMOS transistor 14 has a gate connected to the power supply voltage VDD, a source connected to the drain of the NMOS transistor 15 and the drain connected to the source of the PMOS transistor 17 through the node 20.

The NMOS transistor 15 has a gate connected to the power supply voltage VDD, a source connected to the resistor 16 and the drain connected to the source of the NMOS transistor 14.

The resistor 16 is connected between the source of the NMOS transistor 15 and the ground voltage GND. The resistor 21 is connected between the output terminal OUT and the external power supply voltage. The resistor 16 has a resistance larger than that of the external resistor 21.

The NMOS transistor 14, NMOS transistor 15 and resistor 16 function as an earth circuit for removing charges stored on the node 20 when the potential of the node 20 rises.

Next, the operation of the output circuit 10 for the semiconductor integrated circuit according to the first embodiment will be described.

A description will hereinafter be given of the circuit operation when the power supply voltage VDD of the semiconductor integrated circuit device is 3.3V and the external power supply voltage VTT to which the output terminal OUT is connected is 5V.

In FIG. 1, when the input terminal IN becomes 'L' in level, the output of the inverter circuit 11 becomes 'H' in level.

Accordingly, the PMOS transistor 12 whose gate is connected to the output of the inverter circuit 11 is turned off and the NMOS transistor 19 whose gate is connected to the output of the inverter circuit 11 is turned on. The NMOS transistor 18 is normally on, so that the potential of the output terminal OUT becomes 'L' in level.

Because the PMOS transistor 17 is off, the node 20 becomes 'L' in level by means of the NMOS transistors 14 and 15 and the resistor 16, thereby causing the PMOS transistor 13 to be turned on.

Figure 6:
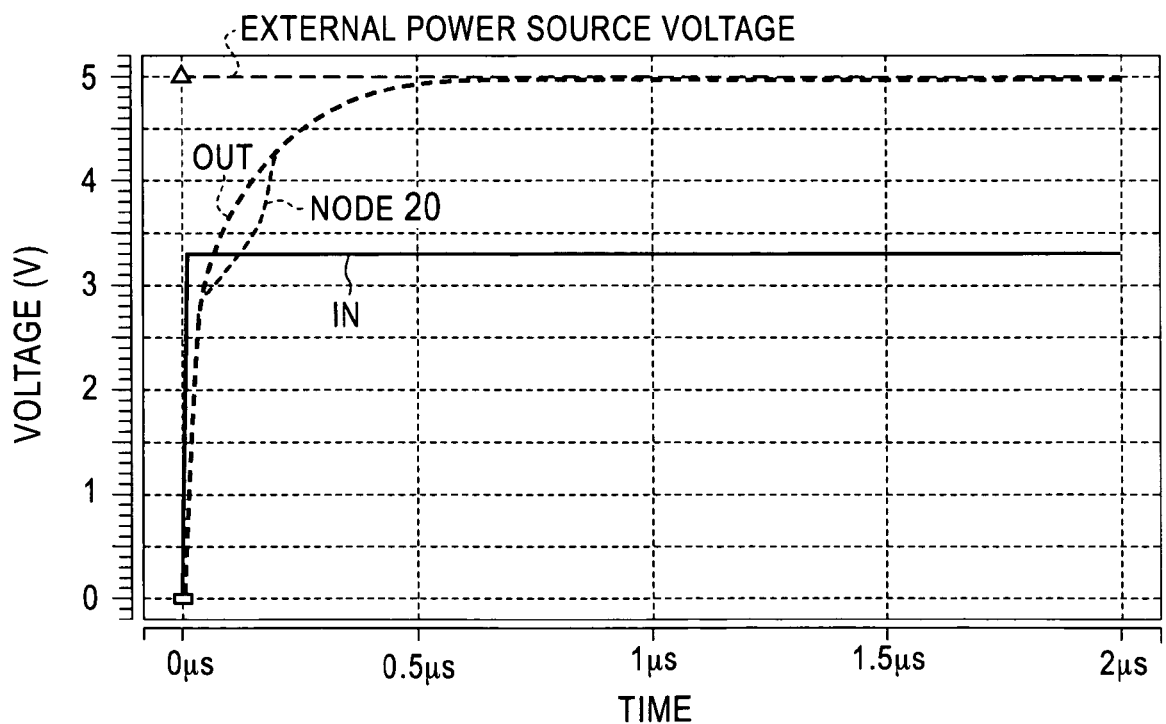
FIG. 6 shows simulation results of variations in respective potentials of an input terminal, output terminal and node in the output circuit of FIG. 1.

Referring next to FIG. 6, a description will be given of the voltage rising of the output terminal OUT to an 'H' level when the input terminal IN makes an 'L' to 'H' level transition. FIG. 6 shows variations in respective potentials of the input terminal IN, output terminal OUT and node 20 in the output circuit 10.

When the input terminal IN is changed from 'L' to 'H' in level, the output of the inverter circuit 11 goes to 'L' in level. Accordingly, the PMOS transistor 12 is turned on and the NMOS transistor 19 is turned off, so the potential of the output terminal OUT begins to be changed to an 'H' level.

By this operation, the potential of the node 20 also approximates an 'H' level because of a coupling capacitance between the source and gate of the PMOS transistor 13. Also, by the external power supply voltage 5V, the PMOS transistor 13 approximates an OFF state and the PMOS transistor 17 approximates an ON state.

When the potential of the output terminal OUT exceeds the internal power supply potential (3.3V), the PMOS transistor 17 is turned on and external current from the output terminal OUT flows through the PMOS transistor 17, so that the potential of the node 20 rises.

As the potential of the node 20 rises, the gate potential, source potential and drain potential of the PMOS transistor 13 become the same as the potential of the output terminal OUT. As a result, the PMOS transistor 13 is turned off and the output terminal OUT assumes the external voltage level (5V).

The path of the external current to the PMOS transistor 12 is removed owing to the fact that the PMOS transistor 13 is turned off. As a result, the external current flows to the PMOS transistor 17 without flowing to the PMOS transistor 12.

Because the PMOS transistor 17 is on, the external current continuously flows to the node 20. Because the resistance of the resistor 16 is larger than that of the external resistor 21, the node 20 rapidly rises to the external voltage level (5V).

As described above, owing to the fact that the PMOS transistor 13 is turned off, it is possible to prevent the flow of the external current to the PMOS transistor 12.

By turning the PMOS transistor 13 and NMOS transistor 19 off, the external current flows to the PMOS transistor 17 via the output terminal OUT.

Figure 7:
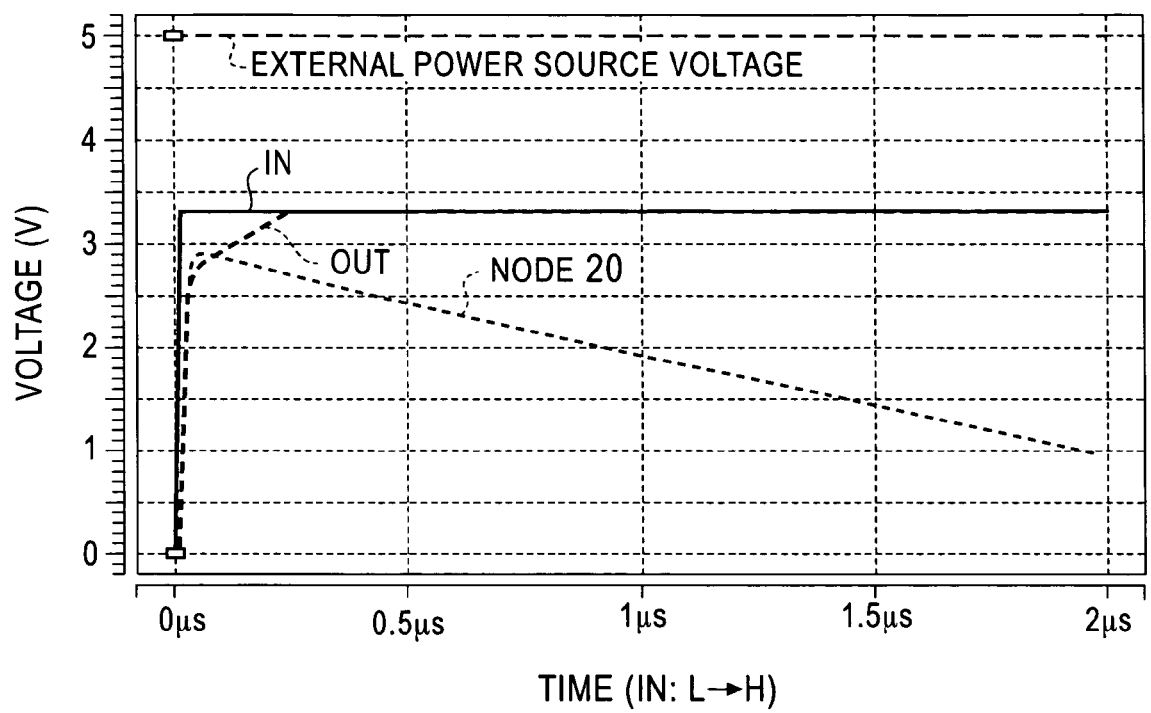
FIG. 7 also illustrates simulation results of variations in the respective potentials of the input terminal, output terminal and node in the output circuit of FIG. 1.

Referring next to FIG. 7, a description will be given of the voltage rising of the output terminal OUT when the external resistor 21 shown in FIG. 1 is removed and the external power supply voltage is applied to the output terminal OUT, not via the external resistor 21.

When the input terminal IN becomes 'L' in level, the output of the inverter circuit 11 becomes 'H' in level, the PMOS transistor 12 is turned off and the NMOS transistor 19 is turned on. The NMOS transistor 18 is normally on. As a result, the output terminal OUT becomes 'L' in level.

At this time, because the PMOS transistor 17 is off, the node 20 becomes 'L' in level by means of the NMOS transistor 14, NMOS transistor 15 and resistor 16, so that the PMOS transistor 13 is turned on.

When the input terminal IN is changed to 'H' in level from this state, the output of the inverter circuit 11 goes to 'L' in level, thereby causing the NMOS transistor 19 to be turned off and the PMOS transistor 12 to be turned on. As a result, the output terminal OUT begins to be changed to an 'H' level.

By this operation, the potential of the node 20 approximates an 'H' level because of a MOS coupling capacitance, but is not influenced by the external voltage due to the absence of the external resistor 21. Also, since the PMOS transistor 17 is off and the node 20 becomes 'L' in level by virtue of the NMOS transistor 14, NMOS transistor 15 and resistor 16, the output terminal OUT goes to 'H' in level.

As is apparent from the above description, according to the present embodiment, the output terminal is connected to the external voltage (5V) via the external resistor so that it can generate, as an 'H' level signal, a 5V signal having an operating amplitude of 0 to 5V. Therefore, the output circuit of the present embodiment can interface the semiconductor integrated circuit device with an LSI which has a VIH voltage, for example, CMOS 5V, higher than the internal voltage. Further, the output signal is generated by the internal transistors up to the internal voltage level 3.3V, thereby making it possible for the output circuit to operate more rapidly than an open drain circuit.

When the interface level is 3.3V, the output circuit can operate with an amplitude of 0 to 3.3V by removing the external resistor.

(B) Second Embodiment

A second embodiment of an output circuit according to the present invention will be described with reference to FIGS. 8 to 10.

Figure 8:
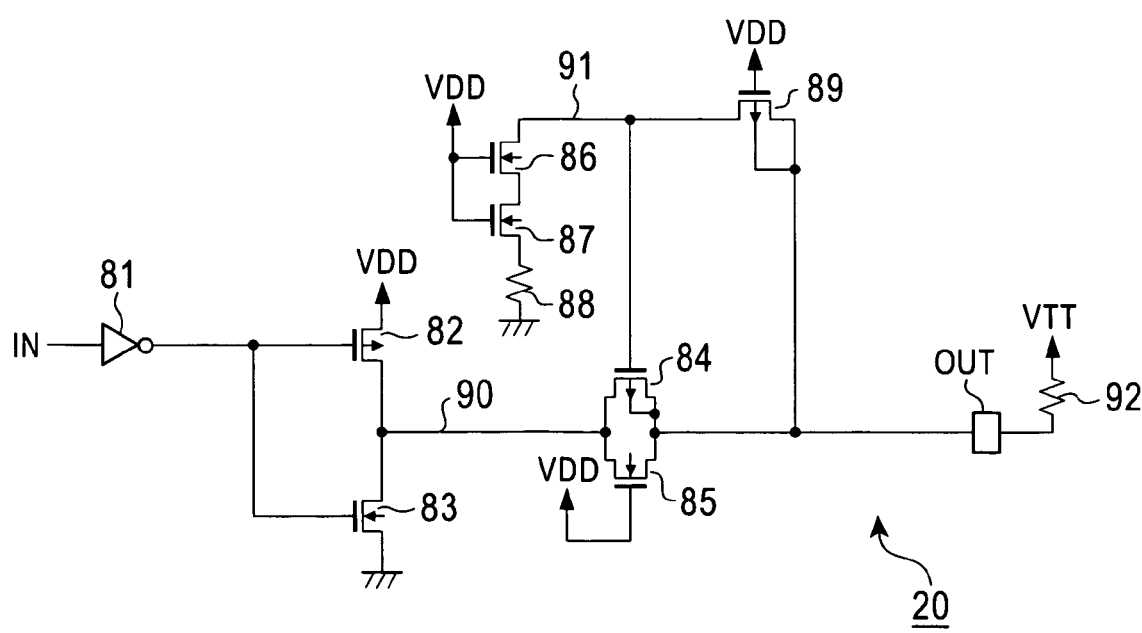
FIG. 8 illustrates a circuit diagram of an output circuit according to a second embodiment of the present invention.

FIG. 8 is a circuit diagram of an output circuit for a semiconductor integrated circuit according to the second embodiment.

As shown in FIG. 8, the output circuit for the semiconductor integrated circuit according to the second embodiment is denoted by reference numeral 20 and includes an inverter circuit 81, a PMOS transistor 82, an NMOS transistor 83, a transfer gate consisting of a PMOS transistor 84 and NMOS transistor 85, NMOS transistors 86 and 87, a resistor 88, and a PMOS transistor 89.

An output terminal OUT is connected to an external power supply voltage via a resistor 92.

An input terminal IN is connected to the input of the inverter circuit 81. The output of the inverter circuit 81 is connected to the gate of the PMOS transistor 82 and the gate of the NMOS transistor 83.

The PMOS transistor 82 has the gate connected to the output of the inverter circuit 81, a source connected to a power supply voltage VDD for output and a drain connected to the transfer gate consisting of the PMOS transistor 84 and NMOS transistor 85 through a node 90.

The NMOS transistor 83 has the gate connected to the output of the inverter circuit 81, a source connected to a ground voltage GND and a drain connected to the transfer gate through the node 90. The transfer gate has the PMOS transistor 84 and NMOS transistor 85.

The node 90 is connected between the drains of the PMOS transistor 82 and NMOS transistor 83, and the drains of the PMOS transistor 84 and NMOS transistor 85.

The PMOS transistor 84 has a gate connected to a node 91, a source and bulk connected to the output terminal OUT and the drain connected to the node 90.

The NMOS transistor 85 has a gate connected to the power supply voltage VDD, a source connected to the output terminal OUT and the drain connected to the node 90.

The PMOS transistor 84 and NMOS transistor 85 are connected between the node 90 and the output terminal OUT.

The NMOS transistor 86 has a gate connected to the power supply voltage VDD, a source connected to the drain of the NMOS transistor 87 and a drain connected to the node 91.

The NMOS transistor 87 has a gate connected to the power supply voltage VDD, a source connected to the resistor 88 and the drain connected to the source of the NMOS transistor 86.

The resistor 88 is connected between the NMOS transistor 87 and the ground voltage GND.

The NMOS transistor 86, NMOS transistor 87 and resistor 88 function as an earth circuit for removing charges stored on the node 91 when the potential of the node 91 rises.

The PMOS transistor 89 has a gate connected to the power supply voltage VDD, a source and bulk connected to the output terminal OUT and a drain connected to the node 91. This PMOS transistor 89 is connected between the node 91 and the output terminal OUT.

The bulk of the PMOS transistor 82 is connected to the power supply voltage VDD and the bulk of the NMOS transistor 83 is connected to the ground voltage GND.

Next, the operation of the output circuit for the semiconductor integrated circuit device according to the second embodiment will be described with reference to FIG. 8 to FIG. 10.

A description will hereinafter be given of the circuit operation when the internal power supply potential connected to the transistors is 3.3V and the external power supply potential connected to the output terminal OUT via the resistor 92 is 5V.

Figure 9:
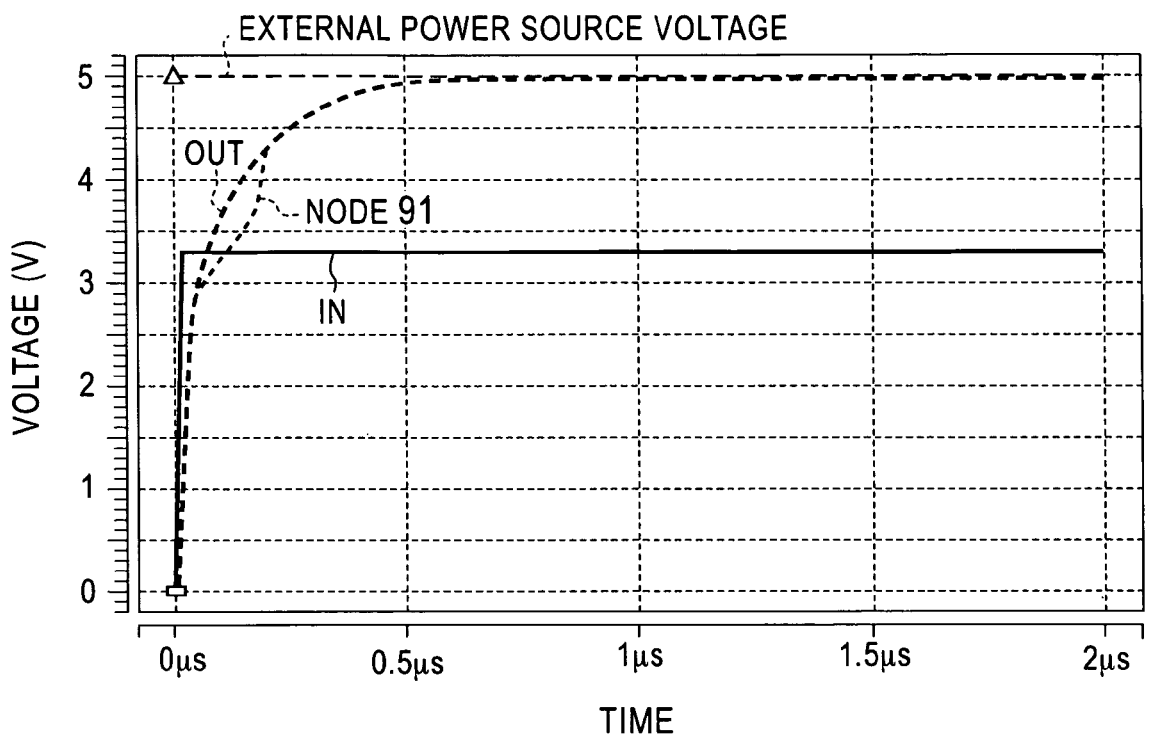
FIG. 9 depicts simulation results of variations in potentials of an input terminal, output terminal and node in the output circuit shown in FIG. 8.

FIG. 9 illustrates voltage rising timing of the output terminal OUT according to the second embodiment.

When the input terminal IN becomes 'L' in level, the output of the inverter circuit 81 becomes 'H' in level, thereby causing the PMOS transistor 82 to be turned off and the NMOS transistor 83 to be turned on. The NMOS transistor 85 is normally on. As a result, the output terminal OUT becomes 'L' in level.

The PMOS transistor 89 is off and the node 91 becomes 'L' in level by means of the NMOS transistors 86 and 87 and the resistor 88, thereby causing the PMOS transistor 84 to be turned on.

When the input terminal IN goes from 'L' to 'H' in level from this state, the output of the inverter circuit 81 becomes 'L' in level. Accordingly, the PMOS transistor 82 is turned on, the NMOS transistor 83 is turned off and the node 90 thus goes to 'H' in level, so the output terminal OUT begins to be changed to an 'H' level.

By this operation, the node 91 approximates an 'H' level because of a coupling capacitance and, by the external power supply potential 5V, the PMOS transistor 84 approximates an OFF state and the PMOS transistor 89 approximates an ON state.

If the potential of the output terminal OUT exceeds the internal power supply potential (3.3V), the PMOS transistor 89 is turned on and the gate voltage, source voltage and drain voltage of the PMOS transistor 84 thus become the same as the potential of the output terminal OUT. As a result, the PMOS transistor 84 is turned off and the output terminal OUT thus assumes the external power supply potential (5V).

Figure 10:
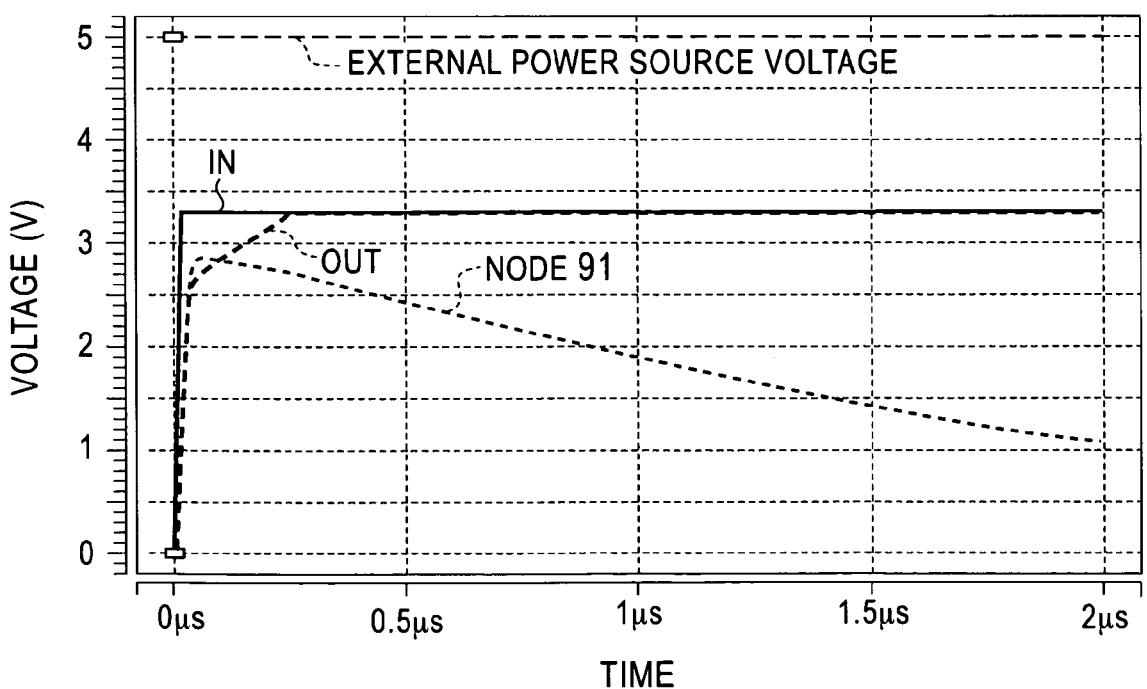
FIG. 10 also depicts simulation results of variations in the potentials of the input terminal, output terminal and node in the output circuit shown in FIG. 8.

FIG. 10 illustrates voltage rising timing of the output terminal OUT when the resistor 92 for the external voltage is removed.

When the input terminal IN becomes the L level, the output of the inverter circuit 81 goes to the H level, thereby causing the PMOS transistor 82 to be turned off and the NMOS transistor 83 to be turned on. The NMOS transistor 85 is normally on. As a result, the output terminal OUT becomes the L level.

Because the PMOS transistor 89 is off and the node 91 becomes the L level by means of the NMOS transistors 86 and 87 and the resistor 88, the PMOS transistor 84 is turned on.

When the input terminal IN is changed from 'L' to 'H' in level from this state, the output of the inverter circuit 81 becomes 'L' in level. Accordingly, the NMOS transistor 83 is turned off, the PMOS transistor 82 is turned on and the node 90 thus goes to the H level. As a result, the output terminal OUT begins to be changed to the H level.

By this operation, the node 91 approximates an 'H' level because of a MOS coupling capacitance, but is not influenced by the external voltage due to the absence of the external resistor. Also, since the PMOS transistor 89 is off and the node 91 goes to the L level by virtue of the NMOS transistors 86 and 87 and the resistor 88, the output terminal OUT becomes the H level.

According to the second embodiment, the output terminal is connected to the external voltage (5V) via the external resistor so that it can generate, as an 'H' level signal, a 5V signal having an operating amplitude of 0 to 5V. Therefore, the output circuit of the present embodiment can interface the semiconductor integrated circuit device with an LSI which has a VIH voltage, such as CMOS 5V, higher than the internal voltage. The output signal is generated by the internal transistors up to the internal voltage level 3.3V, thereby making it possible for the output circuit to operate more rapidly than an open drain circuit.

When the interface level is 3.3V, the output circuit can operate with an amplitude of 0 to 3.3V by removing the external resistor.

The PMOS transistors 84 and 89, the NMOS transistors 85 to 87 and the resistor 88 can be separately installed between the node 90 and the output terminal OUT and it is thus possible to add functions to the existing layout data.

(C) Other Embodiments

Although the output circuit of the first embodiment operates according to the push-pull circuit logic, the output circuit of the present invention is also able to operate as a tri-state output circuit if the PMOS transistor 12 and NMOS transistor 19 are logically configured to operate according to tri-state logic.

Although the inverter circuit 81, PMOS transistor 82 and NMOS transistor 83 of the second embodiment operate according to the push-pull circuit logic, they may constitute a tri-state circuit so that the output circuit of the invention is also able to operate as a tri-state output circuit.

The present invention is not limited to the circuit configurations disclosed in the first and second embodiments. For example, a PMOS transistor may be replaced by an NMOS transistor or vice versa by inverting the polarity of a power supply voltage. Also, a device such as a bipolar transistor may be used instead of each MOS transistor.

It should be noted that the preferred embodiments of the present invention have been disclosed for illustrative purposes, and those skilled in the art will appreciate that various modifications, additions and substitutions are possible, without departing from the scope and spirit of the invention as defined in the appended claims.

This application is based on a Japanese Patent Application No. 2004-244186 filed on Aug. 24, 2004 and the entire disclosure thereof is incorporated herein by reference.

What is claimed is:

1. An output circuit for supplying a voltage within a potential range, said output circuit comprising:
   a power supply terminal;
   a ground terminal;
   an output teminal for connection with an external power supply voltage, the potential range being determined by a potential of the power supply terminal and a potential of the ground terminal, the output circuit supplying the voltage from the output terminal;
   a first transistor having one main electrode connected to the power supply terminal and another main electrode connected to the output terminal;
   a second transistor having one main electrode connected to a control electrode of the first transistor and another main electrode connected to the output terminal; and
   an earth circuit connected to the control electrode of the first transistor for removing charges stored on the control electrode of the first transistor,
   wherein the second transistor is turned on when the voltage of the output terminal is beyond the potential range,
   wherein the first transistor is turned off when the voltage of the output terminal is introduced to the control electrode of the first transistor upon turning on of the second transistor, and
   wherein the earth circuit includes:
      a resistor connected to the ground terminal;
      a third transistor having one main electrode connected to the control electrode of the first transistor and a control electrode connected to the power supply terminal; and
      a fourth transistor having one main electrode connected to the third transistor, another main electrode connected to the resistor and a control electrode connected to the power supply terminal.

2. The output circuit as set forth in claim 1, wherein the output terminal is connected to the external power supply voltage via an external resistor, and the resistor included in the earth circuit has a resistance larger than that of the external resistor.

3. The output circuit as set forth in claim 1, further comprising:
   an input terminal;
   a third transistor having a control electrode connected to the input terminal, one main electrode connected to the power supply terminal and another main electrode connected to the first transistor;
   a fourth transistor having a control electrode connected to the input terminal and one main electrode connected to the ground terminal, the fourth transistor having another main electrode; and
   a fifth transistor having one main electrode connected to the another main electrode of the fourth transistor, another main electrode connected to the output terminal and a control electrode connected to the power supply terminal.

4. An output circuit for supplying a voltage within a potential range, said output circuit comprising:
   a power supply terminal;
   a ground terminal;
   an output terminal for connection with an external power supply voltage, the potential range being determined by a potential of the power supply terminal and a potential of the ground terminal, the output circuit supplying the voltage from the output terminal;
   first transistor means having a first main electrode connected to the power supply terminal and a second main electrode connected to the output terminal;
   second transistor means having a first main electrode connected to a control electrode of the first transistor means and a second main electrode connected to the output terminal; and
   earth means connected to the control electrode of the first transistor means for removing charges stored on the control electrode of the first transistor means,
   wherein the second transistor means is turned on when the voltage of the output terminal is outside the potential range,
   wherein the first transistor means is turned off as the voltage of the output terminal is introduced to the control electrode of the first transistor means when the second transistor means is turned on,
   wherein the earth means comprises a resistor, the output terminal is connected to the external power supply voltage via an external resistor, and the resistor in the earth means has a resistance larger than that of the external resistor,
   wherein the output circuit further comprises:
      an input terminal;
      third transistor means having a control electrode connected to the input terminal, a first main electrode connected to the power supply terminal and a second main electrode connected to the first transistor means;
      fourth transistor means having a control electrode connected to the input terminal, a first main electrode connected to the ground terminal, and a second main electrode; and
      fifth transistor means having a first main electrode connected to the second main electrode of the fourth transistor, a second main electrode connected to the output terminal and a control electrode connected to the power supply terminal,
   wherein the resistor in the earth means is connected to the ground terminal, and
   wherein the earth means includes:
      sixth transistor means having a first main electrode connected to the control electrode of the first transistor means and a control electrode connected to the power supply terminal; and
      seventh transistor means having a first main electrode connected to the sixth transistor means, a second main electrode connected to the resistor and a control electrode connected to the power supply terminal.

5. An output circuit for supplying an output voltage within a potential range, said output circuit comprising:
   a power supply terminal;
   a ground terminal;
   an output terminal for connection with an external power supply voltage, the potential range being determined by a potential of the power supply terminal and a potential of the ground terminal, the output circuit supplying the voltage from the output terminal;
   a first transistor having one main electrode that selectively receives a power supply voltage from the power supply terminal and another main electrode connected to the output terminal;
   a second transistor having one main electrode connected to a control electrode of the first transistor and another main electrode connected to the output terminal; and an earth circuit connected to the control electrode of the first transistor for removing charges stored on the control electrode of the first transistor, wherein the second transistor is turned on when the voltage of the output terminal is beyond the potential range, wherein the first transistor is turned off when the voltage of the output terminal is introduced to the control electrode of the first transistor upon turning on of the second transistor, and wherein the earth circuit includes:
a resistor connected to the ground terminal;
a third transistor having one main electrode connected to the control electrode of the first transistor and a control electrode connected to the power supply terminal; and
a fourth transistor having one main electrode connected to the third transistor, another main electrode connected to the resistor and a control electrode connected to the power supply terminal.

6. The output circuit as set forth in claim 5, wherein the output terminal is connected to the external power supply voltage via an external resistor, and the resistor that is included in the earth circuit has a resistance larger than that of the external resistor.

7. The output circuit as set forth in claim 5, further comprising:
an input terminal;
an inverter coupled to the input terminal;
a third transistor that selectively provides the power supply voltage to the first transistor, the third transistor having a control electrode connected to the inverter, one main electrode connected to the power supply terminal and another main electrode connected to the first transistor;
a fourth transistor having a control electrode connected to the inverter and one main electrode connected to the ground terminal, the fourth transistor having another main electrode; and
a fifth transistor having one main electrode connected to the another main electrode of the fourth transistor, another main electrode connected to the output terminal and a control electrode connected to the power supply terminal.

8. The output circuit as set forth in claim 5, further comprising:
an input terminal;
an inverter connected to the input terminal;
a third transistor that selectively provides the power supply voltage to the first transistor, the third transistor having a control electrode connected to the inverter and one main electrode connected to the power supply terminal, the third transistor having another main electrode;
a fourth transistor having a control electrode connected to the inverter and one main electrode connected to the ground terminal, the fourth transistor having another main electrode; and
a fifth transistor having one main electrode connected to the another main electrodes of the third and fourth transistors, another main electrode connected to the output terminal and a control electrode connected to the power supply terminal.

9. An output circuit for supplying an voltage within a potential range, said output circuit comprising:
a power supply terminal;
a ground terminal;
an input terminal;
an inverter coupled to the input terminal;
an output terminal for connection with an external power supply voltage, the potential range being determined by a potential of the power supply terminal and a potential of the ground terminal, the output circuit supplying the voltage from the output terminal;
first transistor means having a first main electrode that selectively receives a power supply voltage from the power supply terminal and a second main electrode connected to the output terminal;
second transistor means having a first main electrode connected to a control electrode of the first transistor means and a second main electrode connected to the output terminal;
third transistor means that selectively provides the power supply voltage to the first transistor means, the third transistor means having a control electrode connected to the inverter, a first main electrode connected to the power supply terminal, and a second main electrode connected to the first transistor means;
fourth transistor means having a control electrode connected to the inverter, a first main electrode connected to the ground terminal, and a second main electrode;
fifth transistor means having a first main electrode connected to the second main electrode of the fourth transistor, a second main electrode connected to the output terminal and a control electrode connected to the power supply terminal, and
earth means connected to the control electrode of the first transistor means for removing charges stored on the control electrode of the first transistor means,
wherein the second transistor means is turned on when the voltage of the output terminal is outside the potential range,
wherein the first transistor means is turned off as the voltage of the output terminal is introduced to the control electrode of the first transistor means when the second transistor means is turned on,
wherein the earth means comprises a resistor connected to the ground terminal, the output terminal is connected to the external power supply voltage via an external resistor, and the resistor in the earth means has a resistance larger than that of the external resistor, and
wherein the earth means further includes:
sixth transistor means having a first main electrode connected to the control electrode of the first transistor means and a control electrode connected to the power supply terminal; and
seventh transistor means having a first main electrode connected to the sixth transistor means, a second main electrode connected to the resistor and a control electrode connected to the power supply terminal.

* * * * *